(12) United States Patent
Amelung

(10) Patent No.: US 8,766,286 B2
(45) Date of Patent: Jul. 1, 2014

(54) ORGANIC OPTO-ELECTRIC DEVICE AND A METHOD FOR MANUFACTURING AN ORGANIC OPTO-ELECTRIC DEVICE

(75) Inventor: Joerg Amelung, Dresden (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 552 days.

(21) Appl. No.: 13/071,604

(22) Filed: Mar. 25, 2011

(65) Prior Publication Data

US 2011/0198622 A1   Aug. 18, 2011

Related U.S. Application Data

(63) Continuation of application No. PCT/EP2009/006736, filed on Sep. 17, 2009.

(30) Foreign Application Priority Data

Sep. 26, 2008   (DE) .......................... 10 2008 049 057

(51) Int. Cl.
   *H01L 29/18* (2006.01)

(52) U.S. Cl.
   USPC .............. 257/88; 257/E51.001; 257/E27.119; 257/E51.018; 257/99

(58) Field of Classification Search
   USPC ................... 257/88, E51.001, E27.119, 99
   See application file for complete search history.

(56) References Cited

U.S. PATENT DOCUMENTS

| 2005/0122043 A1 | 6/2005 | Kato et al. |
| 2005/0170551 A1 | 8/2005 | Strip |
| 2008/0008887 A1 | 1/2008 | Liu et al. |
| 2008/0224606 A1 | 9/2008 | Kawai et al. |
| 2009/0133916 A1 | 5/2009 | Grespan |
| 2010/0289007 A1 | 11/2010 | Werner et al. |
| 2011/0297996 A1* | 12/2011 | van den Brand et al. ....... 257/99 |

FOREIGN PATENT DOCUMENTS

| DE | 10 2006 059 168 A1 | 4/2008 | |
| DE | EP 2144290 | * 8/2013 | .............. H01L 27/32 |
| EP | 1 536 491 A2 | 6/2005 | |
| EP | 1 970 960 A2 | 9/2008 | |

(Continued)

OTHER PUBLICATIONS

Official Communication issued in corresponding Japanese Patent Application No. 2011-528221, mailed on Jun. 5, 2012.

(Continued)

*Primary Examiner* — Timor Karimy
(74) *Attorney, Agent, or Firm* — Keating & Bennett, LLP

(57) ABSTRACT

An organic opto-electric device has a layer stack with a base electrode, an organic layer assembly, a cover electrode and a contact layer. The organic layer assembly is arranged between the base electrode and the cover electrode and the cover electrode is arranged between the organic layer assembly and the contact layer. The cover electrode and the base electrode are structured to form several laterally adjacent optically active areas and the base electrode, the organic layer assembly, the cover electrode and the contact layer are interconnected by vias such that at least two optically active areas are connected in series so that a current flow through the at least two optically active areas passes in a direction between the base electrode and a cover electrode. The current flow between the at least two optically active areas passes through the contact layer, wherein the contact layer contacts the base electrode above one of the vias laterally in the interior of the two optically active areas.

13 Claims, 3 Drawing Sheets

(56) References Cited

FOREIGN PATENT DOCUMENTS

| | | |
|---|---|---|
| GB | 2 392 023 A | 2/2004 |
| JP | 2011-527816 A | 11/2011 |
| WO | 2004/057674 A2 | 7/2004 |
| WO | 2008/077615 A1 | 7/2008 |

OTHER PUBLICATIONS

Official Communication issued in International Patent Application No. PCT/EP2009/006736, mailed on Sep. 22, 2010.

* cited by examiner

ORGANIC OPTO-ELECTRIC DEVICE AND A METHOD FOR MANUFACTURING AN ORGANIC OPTO-ELECTRIC DEVICE

CROSS-REFERENCE TO RELATED APPLICATIONS

This application is a continuation of copending International Application No. PCT/EP2009/006736, filed Apr. 1, 2010, which is incorporated herein by reference in its entirety, and additionally claims priority from German Patent Application No. 102008049057.1, which was filed on Sep. 26, 2008, and is incorporated herein in its entirety by reference.

BACKGROUND OF THE INVENTION

Embodiments of the present invention relate to an organic opto-electric device and a method for manufacturing an organic opto-electric device. Further embodiments include the manufacturing of large area devices by means of an organic light-emitting diode structure (OLED) or by means of a solar cell as examples for organic opto-electric devices.

As a flat illuminated body with a moderate luminance as compared to a conventional light-emitting diode (LED), the OLED is ideally suitable for a manufacturing of flat diffuse light sources. Thus, on the basis of organic light-emitting diodes (OLED) new types of flat light elements may be implemented. These light sources are very promising and they are predicted a similar development as compared to the OLED based displays. By the used thin film technology it will become possible in the future to realize OLEDs also as flexible light bodies which enable completely new applications regarding the illumination of rooms.

As OLEDs represent current driven devices, a homogeneous current density distribution on large areas is an important point in the manufacturing of large area illuminated elements. Inhomogeneities in current density distribution along the large area luminous elements would be directly visible in fluctuations of luminosity and thus an accordingly homogeneous current supply is needed to achieve a uniform flat luminance.

As light generation is executed in an organic layer assembly or structure arranged between two electrodes, at least one transparent electrode is needed, so that the light may leave the OLED. The transparent contact is usually realized by a transparent conductive oxide (TCO) or by means of transparent metal layers, wherein the TCO layer or the transparent metal layer frequently comprise a low conductivity. Thus, the transparent contact limits the homogeneity of the current density distribution and thus the maximum size of the luminous surface. Large luminous surfaces would otherwise only be possible with great losses and the interconnected heat development, which is generally not acceptable.

A similar problem also exists with solar cells on the basis of organic materials which are very similar to the OLED regarding their setup. Due to the organic materials used, these structures however enable a conversion of optical radiation into electrical current, wherein this current is drained via the contacts. Also here the transparent electrical contact which is overcome by the incoming light reduces the maximum usable size of the device.

In order to still achieve larger areas (large OLEDs), for example, metal reinforcements in the form of nets (metal grids) are introduced into the exemplary TCO layer. These metal grids (also referred to as bus bars) reduce the effective layer resistance according to the occupancy and thus enable a realization of larger diode areas. Due to the non-transparency of these metal grids, however, the effective luminous surface is reduced. For this reason, metal grids are only sensible for up to approximately 25% of the TCO area. A sensible improvement would be the increase of the grid metal thickness, which is not sensible, however, due to the structuring possibilities and the layer thickness of the organic layer thickness. Another disadvantage apart from this is that the metal reinforced ITO layer is only contacted at the exterior edges which limits the maximum luminous element area or surface despite the effective reduction of the resistance.

As already mentioned above, OLEDs are current driven devices, so that for achieving a minimum luminosity a minimum current is needed which is to be supplied through each OLED portion as uniform as possible. To simultaneously limit the overall current, a parallel connection of OLED elements is unfavorable. What is better is a series connection as it was disclosed for example for conventional OLED structures in U.S. Pat. No. 7,307,278, U.S. Pat. No. 7,034,470 and U.S. Pat. No. 6,693,296. Apart from this, in DE 102007004509 A1 an improvement of the homogeneity by a second metalization level was achieved with a thick metal sheet which contacts the transparent contact layers with a low resistance. This second metalization plane thus enables a low resistance contact and thus the manufacturing of extensive light elements. The mentioned second metalization plane is here arranged on the non-transparent OLED electrode (first metalization plane). An electric insulation of the second metalization plane from the first metalization plane is achieved by an insulation layer. This insulation layer is interrupted in partial areas by open sites (so-called vias) through which the contact to the transparent (higher resistance) layer is achieved.

The disadvantages of conventional LED structures includes an inhomogeneous current density distribution or the reduction of the luminous efficacy caused by metal grids. Further disadvantages are visible transition areas in a series connection of OLED elements or the needed high current densities in a parallel connection.

SUMMARY

According to an embodiment, an organic opto-electric device may have a layer stack having a base electrode, an organic layer assembly, a cover electrode, an insulation layer and a contact layer, wherein the organic layer assembly is arranged between the base electrode and the cover electrode and the cover electrode is arranged between the organic layer assembly and the contact layer, and wherein the cover electrode and the base electrode are structured to form several laterally adjacent optically active areas and the base electrode, the organic layer assembly, the cover electrode 140 and the contact layer are interconnected by vias such that at least a first and a second optically active area are connected in series such that a current flow through the at least two optically active areas is directed into a direction between the base electrode and the cover electrode, the current flow passes between the at least two optically active areas through the contact layer, the contact layer contacts the base layer through one of the vias laterally in an interior of the second optically active area, the insulation layer is partially arranged between the contact layer and the cover electrode, so that within the second optically active area the respective contact layer is electrically insulated from the respective cover electrode, and the insulation layer laterally protects the organic layer assembly.

According to another embodiment, a luminous element may have a plurality of organic opto-electric devices connected in series or in parallel, wherein the organic optoelectric devices in turn may have a layer stack having a base electrode, an organic layer assembly, a cover electrode, an insulation layer and a contact layer, wherein the organic layer assembly is arranged between the base electrode and the cover electrode and the cover electrode is arranged between the organic layer assembly and the contact layer, and wherein the cover electrode and the base electrode are structured to form several laterally adjacent optically active areas and the base electrode, the organic layer assembly, the cover electrode and the contact layer are interconnected by vias such that at least a first and a second optically active area are connected in series such that a current flow through the at least two optically active areas is directed into a direction between the base electrode and the cover electrode, the current flow passes between the at least two optically active areas through the contact layer, the contact layer contacts the base layer through one of the vias laterally in an interior of the second optically active area, the insulation layer is partially arranged between the contact layer and the cover electrode, so that within the second optically active area the respective contact layer is electrically insulated from the respective cover electrode, and the insulation layer laterally protects the organic layer assembly, wherein the luminous element forms a luminous surface and the luminous surface is formed by optically active areas arranged in a mosaic.

According to another embodiment, a method for manufacturing an OLED structure may have the steps of providing a substrate; forming a base electrode; structuring the base electrode so that a first part and a second part are formed; forming an organic layer assembly on the base electrode; forming a cover electrode; structuring the cover electrode so that a first part and a second part are formed, wherein the first part of the cover electrode is implemented on the organic layer assembly opposite to the first part of the base electrode, so that a first optically active area is formed, and wherein the second part of the cover electrode is formed on the organic layer assembly opposite to the second part of the base electrode so that a second optically active area is formed; forming an insulation layer on the cover electrode; forming a contact layer on the insulation layer and structuring the contact layer so that a first part and a second part are formed; forming vias between the first part of the contact layer and the first part of the base electrode and between the second part of the contact layer and the second part of the base electrode; forming a further via between the second part of the contact layer and the first part of the cover electrode, so that a series connection between the first optically active area and the second optically active area is formed.

The central idea of the present invention on the one hand consists in using a second metalization layer (contact layer) for an opto-electric organic device, wherein the contact layer is separated from the first (non-transparent) metalization layer by an insulation layer to contact the base electrode (transparent electrode) and apart form that to enable a series connection of several optically active areas through vias or contact elements. Optionally, the insulation layer may further be used to provide an encapsulation for the organic layer structure, so that a large-area or extensive compact luminous element is formed in which the individual optically active areas may be brought so close to each other that no transitions are visible and a homogeneous current supply is enabled through all flat elements or surface areas.

Examples for organic opto-electric devices for example include an OLED or an OLED structure and also an organic solar cell. A standard setup of an OLED or solar cell as a base electrode for example comprises a transparent ITO layer (indium tin oxide). Onto the transparent ITO layer then, for example, an organic layer or an organic layer assembly is applied which may, in part, comprise up to seven sub-layers. Finally, a metallic cathode (first metalization layer or top electrode) is formed. As, like with conventional contacts, the ITO layer is only contacted at the edge of the luminous element, with large area luminous or solar elements, as mentioned above, the high resistance of the ITO layer leads to an inhomogeneity of the current supply. Through this conventional method, the maximum size of a uniformly lighting OLED is limited to approximately 50×50 mm$^2$.

The mentioned contacting at the edge of the luminous element, which leads to the mentioned limitation, further has the following background. The OLED is frequently provided with a further glass layer which comprises a recess for a drying agent and is to cause the OLED to be protected from oxygen and humidity of the air. For this reason, the contacts of the OLED are formed at the edge of the elements. By this, however, a seamless combination of several OLED elements into a large overall area is prevented, as there are gaps between the elements which are optically visible or have to be covered with additional diffusers.

Embodiments thus include an organic opto-electric device having a layer stack comprising a base electrode, an organic layer assembly, a cover electrode and a contact layer. The organic layer assembly is here arranged between the base electrode and the cover electrode, and the cover electrode is arranged between the organic layer assembly and the contact layer. The cover electrode and the base electrode are structured so that several laterally adjacent optically active areas are formed. The base electrode, the organic layer assembly, the cover electrode and the contact layer are here interconnected through vias such that at least two optically active areas are connected in series, so that a current flow through the at least two optically active areas in the same direction between the base electrode and the cover electrode exists and that the current flow passes between the at least two optically active areas through the contact layer, and that further the contact layer and the base electrode are contacted laterally in the interior of one of the two optically active areas.

Optionally, the organic opto-electric device further for example comprises glass as a substrate onto which the base electrode is arranged. The optically active areas are here defined by those lateral areas in which the organic layer assembly is on both sides contacted by the base and cover electrode so that in these areas a light generation is possible with a corresponding current flow. Further, the individual optically active areas may be arranged close to each other such that optically no transition between the individual optically active areas is visible. A thus resulting OLED luminous area element may generate homogeneous light. The vias of the contact layer to the base electrode may, for example, comprise the same material as the second metalization layer (for example, a low resistance metal). It is apart from that advantageous if contacting the base electrode only takes place from a side of the base electrode facing away from the substrate. By this it may be achieved that the vias (contact elements) are not visible from the substrate side.

With further embodiments, the cover electrode further comprises a metal which is structured such that it comprises openings in an inner area through which the vias of the contact layer pass, wherein also in the thus obtained openings the insulation layer is formed so that an insulation between the contact layer/the vias and the cover electrode is achieved.

Optionally, for each optically active area also several vias may be formed so that the base electrode is, for example, contacted point-wise in different points, whereby a further increase of homogeneity of the current density and thus the luminance is achieved. Further, optionally, the contacting of the cover electrode may be executed by further vias which are formed between the contact layer and the cover electrode or by a contacting along a strip. The contacting of the contact layer and also the contacting of the cover electrode may be executed via an edge area of the extensive organic opto-electric device. The layer thickness of the contact layer may further be selected such that the surface resistance of the contact layer is of a low resistance or does not exceed a given threshold value.

With the proposed type of contacting, the terminal resistance is thus no longer defined by the transparent electrode, but only by the surface resistance of the contact layer (second metalization plane). By the use of a high layer thickness (for example in the form of a thick layer or a massive metal plate) on the one hand the terminal resistance may be reduced and on the other hand the possibility results to use the layer as an encapsulation of the system. Thus, a direct contacting of the luminous elements from the metal side is possible as no additional passivation or encapsulation is needed. An edge-free assembly of the OLED/solar cell segments thus is possible.

The use of the series connection of the diode (optically active areas) also enables a reduction of the overall current and simultaneously an increase of the luminous surface. Thus, for a given overall current, a larger luminous surface may be realized than it would be possible with conventional OLED/solar cell elements. According to embodiments, thus, the manufacturing of extensive OLED/solar cell luminous elements at the manufacturing of OLED/solar cell luminous elements connected in series becomes possible.

Embodiments of the present invention thus change conventional contacting types such that also a second (disadvantageous) effect—i.e. the increased current density—is improved as a result of the conventional OLED manufacturing.

With further embodiments, the optically active areas may be implemented differently, so that, for example, rectangular or hexagonal implementations are possible which form an extensive illuminant or solar cell in the form of a mosaic.

Further embodiments also include a method for manufacturing an organic opto-electric device. In the inventive method, on the substrate the transparent base electrodes are formed and structured so that the base electrode comprises several parts which may be implemented variably. Onto the parts of the base electrode the organic layer assembly is deposited in a further process step. Subsequently, the deposition of the non-transparent cover electrode is executed, wherein this process step may further include a structuring. In the process of structuring the outer dimensions of the optically active areas are defined and further openings are formed though which the vias between the contact layer and the base electrode pass. After structuring the cover electrodes an insulating intermediate layer (insulating layer) is formed which also comprises openings and further openings, wherein the openings serve for a later contacting between the contact layer and the base electrode and the further openings serve for the later contacting between the contact layer and the cover electrode.

The structurings may, for example, include an etch step (e.g. a plasma etching) and the use of a shadow mask. Alternatively, the intermediate layer may also be structured in-situ using a further shadow mask. Subsequently, the deposition and structuring of the contact layer is executed which contacts the base electrodes through the openings (e.g. by means of the vias). This contact layer has a better conductivity than the base electrode and thus reduces the line resistance of the base electrode without restricting the transparence of the base electrode (as it is the case when using a metal grid). Further, through the further openings through further vias the contact layer contacts the cover electrode so that an integrated series connection is formed.

By the interleaved wiring the system generates a series connection of at least two diodes (optically active areas) with a minimum influence on the active areas of the OLED/solar cell. The minimum influence is achieved by putting the via (between contact layer and base electrode) for a series connection into the non-visible area of the OLED/solar cell.

BRIEF DESCRIPTION OF THE DRAWINGS

In the following, embodiments of the present invention are explained in more detail with reference to the accompanying drawings, in which.

DETAILED DESCRIPTION OF THE INVENTION

Figure 1:
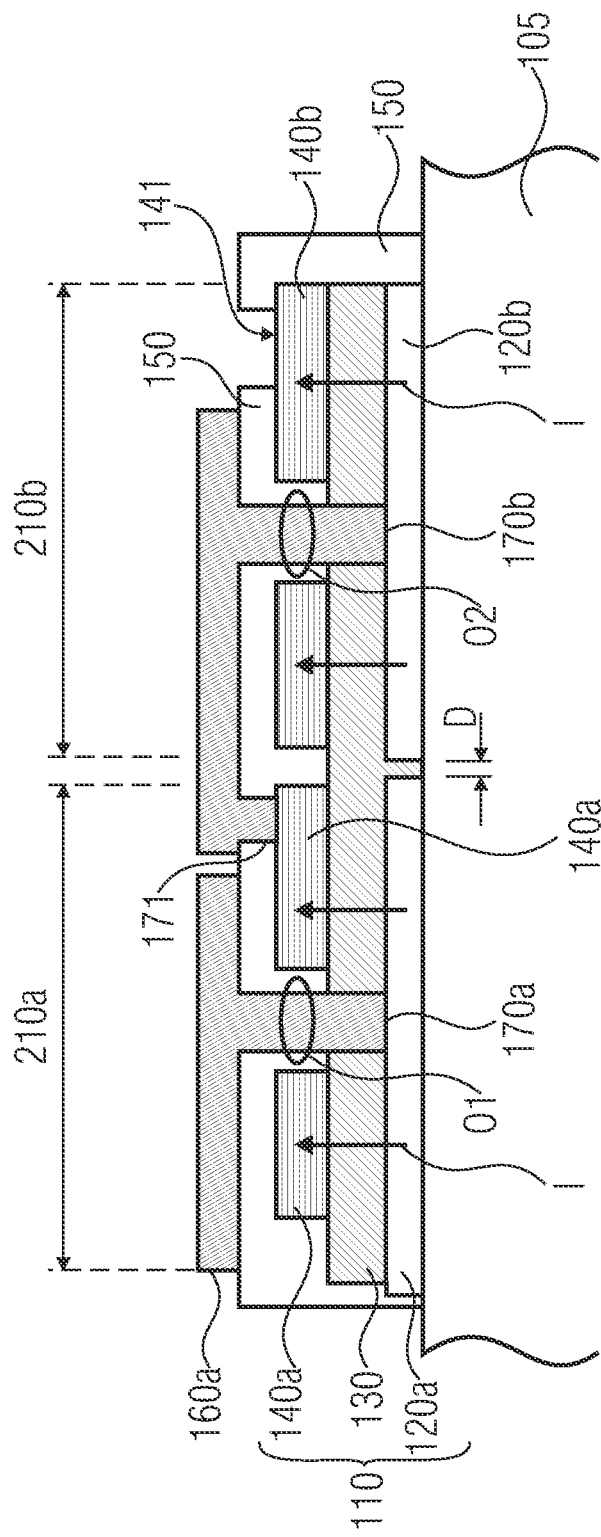
FIG. 1 shows a cross-sectional view through an OLED structure according to the embodiments of the present invention.

Before the present invention is explained in more detail in the following with reference to the drawings, it is noted that like elements in the figures are provided with the same or like reference numerals and that a repeated description of those elements is omitted.

FIG. 1 shows an embodiment for an OLED structure according to an embodiment, wherein the illustrated OLED structure is merely to be regarded as an example and organic solar cells may comprise a completely analog structure.

The illustrated OLED structure comprises a substrate 105 on which a base electrode 120 is formed. The base electrode 120, in the illustrated embodiment, comprises a first part 120a and a second part 120b which are separated from each other along a gap having a width D. Onto the base electrode 120 an organic layer assembly 130 is implemented on which a cover electrode 140 is arranged. The cover electrode 140 comprises (just like the base electrode 120) a first part 140a and a second part 140b which are also separated from each other (electrically insulated). Further, the embodiment comprises a contact layer 160 with a first part 160a and a second part 160b which is electrically insulated from the cover electrode 140 by an insulation layer 150.

The first part of the contact layer 160a is electrically connected to the first part of the base electrode 120a through a first via 170a and the second part of the contact layer 160b is electrically connected to the second part of the base electrode 120b through a second via 170b. Further, the second part of the contact layer 160b is electrically connected to the first part of the cover electrode 140a through a further via 171. The first via 170a is here formed through a first opening O1 of the first part of the cover electrode 140a and the organic layer assembly 130, wherein the first opening O1 of the first part of the cover electrode 140a is implemented such that within the first opening O1 also the insulation layer 150 guarantees and insulation between the first part of the cover electrode 140a and the first via 170a. Likewise, the second part of the contact layer 160b is electrically connected to the second part of the base electrode 120b via a second opening O2 of the second part of the cover electrode 140b and the organic layer assembly, wherein again within the second opening O2 of the second part of the cover electrode 140b the insulation layer 150 is implemented such that the second via 170b is electrically insulated from the second part of the cover electrode 140b. The vias 170 contacting the base electrode 120 from the side facing away from the substrate 105 are not visible from the substrate.

The first part of the base electrode 120a and the first part of the cover electrode 140a are here structured such that they define a first optically active area 210a, that is via the lateral area, via which the organic layer assembly 130 is contacted on both sides from the first part of the base electrode 120a and the first part of the cover electrode 140a. Likewise, a second optically active area 210b is defined by the area via which the organic layer assembly 130 is contacted on both sides by the second part of the base electrode 120b and the second part of the cover electrode 140b.

It is to be noted with respect to the cross-sectional view of FIG. 1, that the openings O1, O2 in which the first and second vias 170a, b are implemented only form openings within the first part of the cover electrode 140a and the second part of the cover electrode 140b. This means that the first part of the cover electrode 140a in the illustrated cross-sectional view does consist of two parts—that both parts are connected with each other, however (in the direction perpendicular to the drawing plane). Likewise, the second part of the cover electrode 140b in the illustrated cross-sectional view comprises two parts which are, however, electrically connected to each other; see also FIG. 2.

During the operation of the device thus a current flow I results which passes in one direction between the base electrode 120 and the cover electrode 140. If, for example, a current I is supplied into the first part of the contact layer 160a, the current flow passes along the first via 170a into the first part of the base electrode 120a and from there, after passing the organic layer assembly 130, to the first part of the cover electrode 140a. The current I is then conducted through the further via 171 into the second part of the cover electrode 160b and from there through the second via 170b into the second part of the base electrode 120b. From here, the current I again passes the organic layer assembly 130 in the direction of the second part of the cover electrode 140b, from where the current I is tapped at a contact pad (terminal contact) 141. Each time when passing the organic layer assembly 130 in the OLED here a part of the energy is converted into light.

The light emission of the OLED structure as it is illustrated in FIG. 1 is executed through the substrate 105 which, for example, comprises glass, and the structuring of the base electrode 120 and the cover electrode 140 is, for example, selected such that the lateral distance D between the first optically active area 210a and the second optically active area 210b is selected so small that optically no boundary between the neighboring optically active areas 210a, b is visible. This means that the distance D is on the one hand selected large enough to guarantee an electric insulation of the first and second part of the base electrode 120a, b, but is also small enough to not make visible a detectable edge structure between the optically active areas and thus a homogeneously radiating luminous surface results. In order to, for example, prevent a current flow to result between the first part of the base electrode 120a and the second part of the cover electrode 140b or vice versa between the second part of the base electrode 120b and the first part of the cover electrode 120a, it may be advantageous to select the lateral extension of the respective part of the cover electrode 140a or 140b smaller than the lateral extension of the respective part of the base electrode 120a or 120b, so that the base electrode 120 laterally goes beyond the cover electrode 140.

The implementation illustrated in FIG. 1 only shows two optically active areas 210, wherein, however, the illustrated structure may be continued accordingly, so that the serial circuit, for example, extends across the overall width of an OLED luminous element. The contacting of the cover electrode 140 may then be executed laterally by the contact pad 141, wherein the contact pad 141 is formed by a recess in the insulation layer 150 so that the cover electrode 140 may be contacted there. Further, also the contact layer 160 may be contacted along the edge area.

In the embodiment illustrated in FIG. 1, the insulation layer 150 further serves to provide a passivation for a layer stack 110 which is formed by the base electrode 120, the organic layer structure 130 and the cover electrode 140, so that both the organic layer assembly 130 and also the base electrode 120 are completely protected from an environment (and in particular laterally). The thus obtained encapsulation (insulation plane) may optionally represent a thin film encapsulation for the organic layer or film 130, so that processing the contact layer 160 does not have to be executed in nitrogen or in a vacuum.

Figure 2:
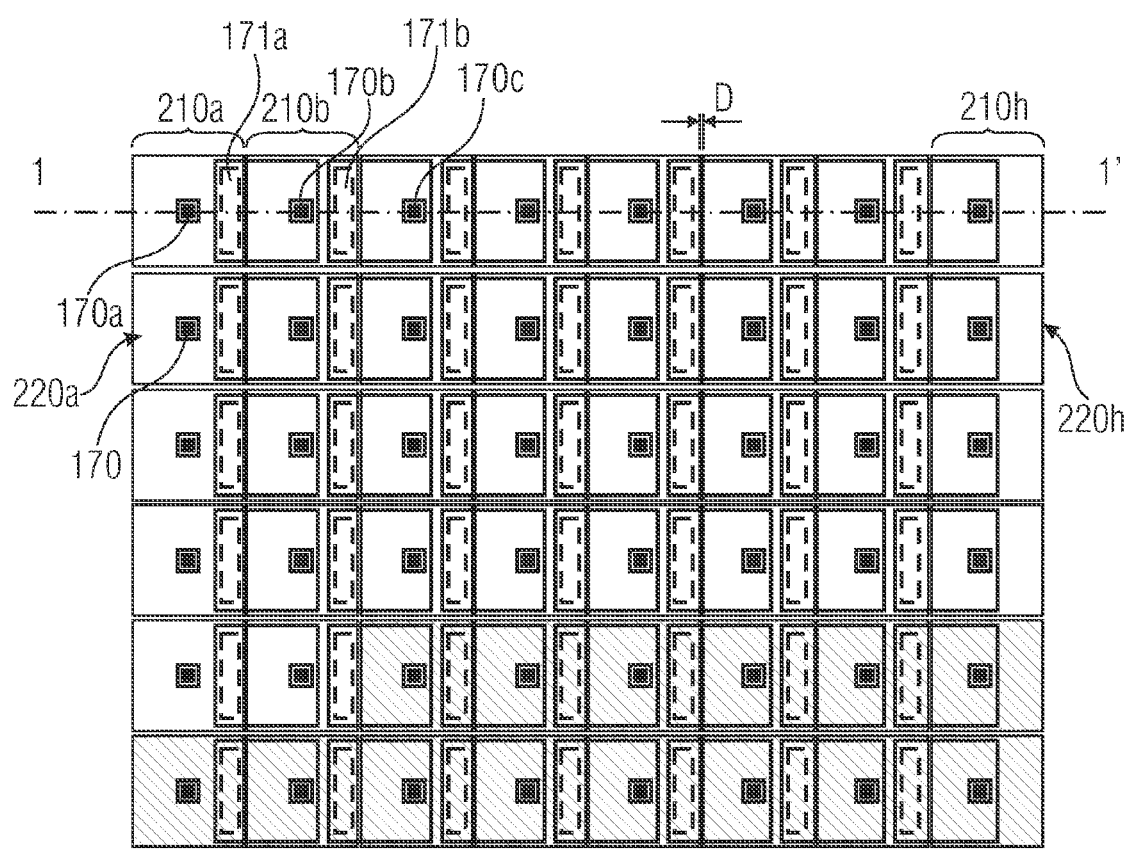
FIG. 2 shows a top view onto a luminous element having rectangularly implemented optically active areas.

FIG. 2 shows a top view onto an extensive luminous element comprising a plurality of optically active areas 210, 220, . . . , wherein the top view of the side facing away from the substrate 105 is illustrated. The cross-sectional view of FIG. 1, for example, relates to the plotted cross-sectional line 1-1'.

In a first row here eight optically active areas 210a, 210b, . . . , 210h connected in series are illustrated which are located at a distance D from each other and were numbered from left to right. In a second row eight optically active areas 220a, . . . , 220h connected in series are illustrated. The flat arrangement is then repeated in a third, fourth, up to a sixth row. Depending on the desired luminous area, the number of optically active areas 210, 220, . . . may be selected differently, so that the illustrated 6×8 arrangement only illustrates a section from an extensive luminous element. In the illustrated top view, the contact layer 160 appears in a rectangular shape that comprises an overlap between two neighboring optically active areas, so that, for example, a connection between the via 170b and the further via 171a may be made and a series connection of the optically active areas 210, 220, . . . results. The first part of the contact layer 160a is not illustrated in the top view of FIG. 2, however. As the illustration of FIG. 2 merely represents a section, the corresponding interconnection structure is to be continued. Alternatively, the first via may also be used as an edge contacting for the serial interconnection.

As it may be seen from the top view of FIG. 2, the vias 170a, b, . . . are virtually central and thus arranged laterally within the optically active areas 210, 220, . . . . The further vias 171 each comprise a longitudinal shape so that they virtually extend across the complete lateral extension (the direction perpendicular to the drawing plane of FIG. 1) of the contact layer 160.

In further embodiments, for each optically active area 210, 220, . . . several vias 170 may be formed so that each of the optically active areas 210 may be interspersed as uniformly as possible with an electric current. Likewise, the further vias 171 may show different forms or comprise areas arranged next to each other (in the direction perpendicular to the drawing level of FIG. 1). It is also obvious that the cover electrode 140 extends around the via 170, so that an optically active area which is as large as possible and thus a light-emitting area which is as large as possible results.

The illustration illustrated in FIG. 2 in the form of optically active areas implemented in a square or a rectangle is only an example, however, wherein in further embodiments the optically active areas may show different forms, wherein again the extensive luminous element (luminous module) is formed in the shape of a mosaic.

Figure 3:
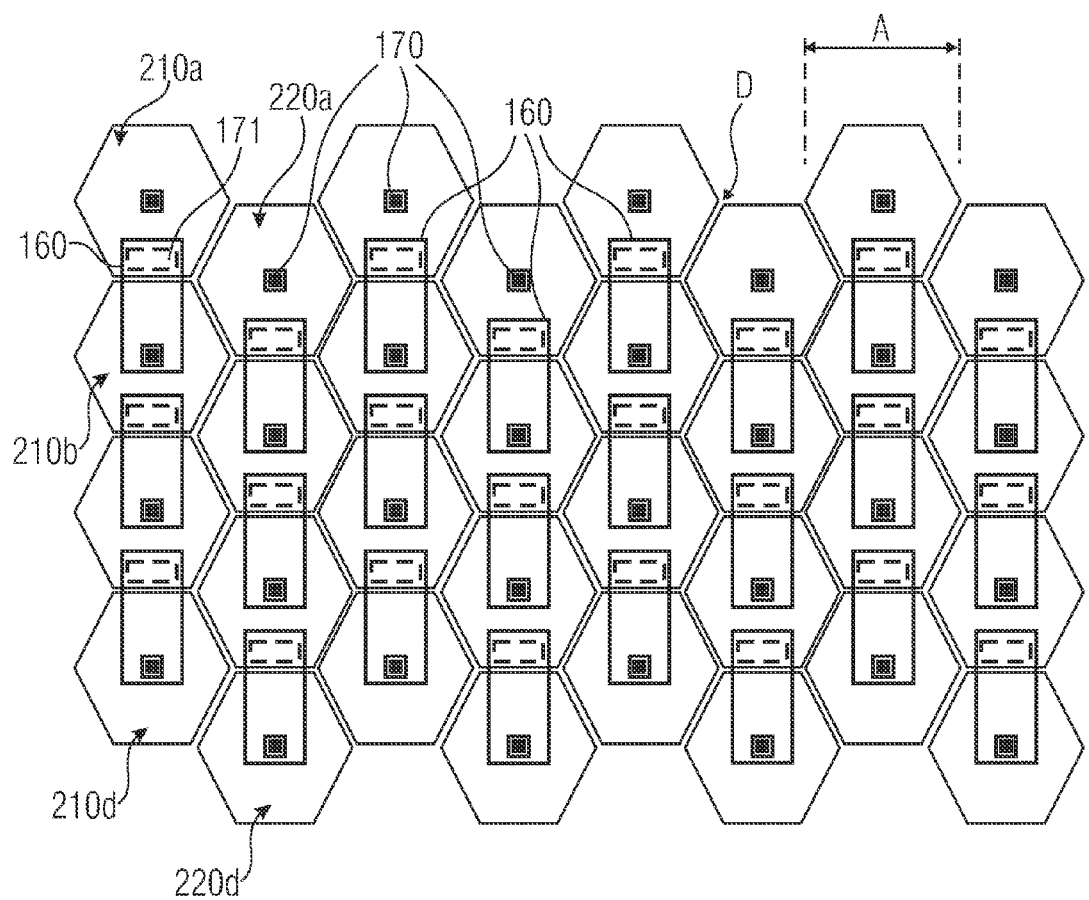
FIG. 3 shows a top view onto an extensive luminous element with optically active areas implemented hexagonally.

FIG. 3 shows such a further embodiment, wherein the optically active areas 210a, 210b, ... are formed in the shape of hexagonally implemented optically active areas 210, 220, .... In the embodiment illustrated here, however, the integrated series connection is formed in a vertical direction. Each optically active area again comprises a via 170, which is again arranged virtually in the center in the hexagonal shape, and a further via 171, which is arranged virtually in parallel to a lateral edge of the hexagonal form. In further embodiments, also several vias 170 may be implemented for each optically active area 210, 220, .... The contact layers 160 again bridge neighboring optically active areas 210, 220, ....

One advantage of the illustrated central arrangement of the via 170 in the optically active areas 210, 220, ... for example is that by this the current supply into the base electrode 120 or in the respective part of the base electrode 120a, b, ... is executed in the center and thus a current supply as uniform as possible is enabled in each of the optically active areas 210a, 210b, .... Alternatively, as mentioned above, several vias may be implemented for each optically active area 210, 220 or a maximum dimension A of the optically active areas 210, 220, ... is selected such that each optically active area 210, 220, ... generates light as uniform as possible. For example, the maximum dimension A may be selected such that also at the edge of each optically active area 210, 220, ... still so much light is generated that a homogenous luminance results (no dark edges).

As in the embodiments illustrated in FIGS. 2 and 3, an electrical connection of the optically active areas 210, 220, ... is executed via the contact layer 160, which may for example each be formed rectangular, no contacting along the edge areas of the optically active areas 210, 220, ... is needed. Thus, the gap B between neighboring optically active areas 210, 220, ... may be minimized, wherein minimizing still also guarantees an electric insulation of the parts of the base electrode 120a, b, ... and the parts of the cover electrode 140a, b, ....

Embodiments of the present invention thus enable an integrated contacting and a simple series interconnection of OLED or solar cell elements or in general of optically active areas 210, 220, ... in combination with a reduction of the non-active areas.

In embodiments, the layers may, for example, comprise the following dimensions. For example, glass with a layer thickness of approximately 0.5 to 2 mm serves as a substrate. The organic layer assembly, for example, comprises up to seven sublayers and may include a layer thickness of approximately 100 to 200 nm. The cover electrode as a metallic cathode frequently comprises aluminum with a layer thickness of approximately 100 to 500 nm. The ITO layer may, for example, comprise a surface resistance of approximately 10 to 40 Ohm/square area which corresponds to layer thicknesses of approximately 90 to 150 nm. Apart from this, the organic layer assembly 130 comprises complementarily doped organic layers forming a pn-transition.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. An organic opto-electric device, comprising:
   a layer stack comprising a base electrode, an organic layer assembly, a cover electrode, an insulation layer and a contact layer, wherein
   the organic layer assembly is arranged between the base electrode and the cover electrode and the cover electrode is arranged between the organic layer assembly and the contact layer,
   the cover electrode and the base electrode are structured to form several optically active areas, which are adjacent to each other in a direction parallel or substantially parallel to major planar surfaces of the layer stack, and the base electrode, the organic layer assembly, the cover electrode and the contact layer are interconnected by vias,
   at least a first and a second optically active area are connected in series such that a current flow within each of the at least the first and second optically active areas is directed in a direction extending between the base electrode and the cover electrode,
   the contact layer contacts the cover electrode in the first optically active area,
   the contact layer contacts the base electrode through one of the vias extending in a direction perpendicular or substantially perpendicular to the major planar surfaces of the layer stack in an interior of the second optically active area, so that the current flow passes between the at least two optically active areas through the contact layer,
   the insulation layer is partially arranged between the contact layer and the cover electrode, so that within the second optically active area the respective contact layer is electrically insulated from the respective cover electrode, and
   the insulation layer protects the organic layer assembly in the direction parallel or substantially parallel to the major planar surfaces of the layer stack.

2. The organic opto-electric device according to claim 1, wherein a first optically active area is formed by a first part of the base electrode and a first part of the cover electrode which contact the organic layer assembly on both sides and a second optically active area is formed by a second part of the base electrode and a second part of the cover electrode which contact the organic layer assembly on both sides, wherein a lateral distance exists between the first optically active area and the second optically active area.

3. The organic opto-electric device according to claim 1, wherein:
   the cover electrode includes via pass openings; and
   the insulation layer is arranged to insulate the cover electrode and the vias within the via pass openings.

4. The organic opto-electric device according to claim 1, wherein a contacting of the cover electrode is executed though a contact pad formed at a first or last of the optically active areas connected in series.

5. The organic opto-electric device according to claim 1, wherein the cover electrode and the contact layer comprise a metal.

6. The organic opto-electric device according to claim 1, further comprising a transparent substrate on which the base electrode is formed and wherein the base electrode comprises a transparent material so that at least two optically active areas are formed on the substrate.

7. The organic opto-electric device according to claim 6, wherein the vias contact the base electrode at a side of the base electrode that is opposite to a side of the base electrode that faces the substrate.

8. The organic opto-electric device according to claim 1, wherein at least two of the vias are arranged in at least one of the first and second optically active areas.

9. The organic opto-electric device according to claim 1, wherein the contact layer comprises a layer thickness which is selected such that a surface resistance of the contact layer lies below a predetermined threshold value.

10. The organic opto-electric device according to claim 1, wherein the organic layer assembly comprises complementarily doped organic layers forming a pn transition.

11. The organic opto-electric device according to claim 1, forming an organic light-emitting diode or an organic solar cell.

12. A luminous element, comprising:
a plurality of organic opto-electric devices connected in series or in parallel, the organic opto-electric devices, comprising:
a layer stack comprising a base electrode, an organic layer assembly, a cover electrode, an insulation layer and a contact layer, wherein
the organic layer assembly is arranged between the base electrode and the cover electrode and the cover electrode is arranged between the organic layer assembly and the contact layer,
the cover electrode and the base electrode are structured to form several optically active areas, which are adjacent to each other in a direction parallel substantially parallel to major planar surfaces of the layer stack, and the base electrode, the organic layer assembly, the cover electrode and the contact layer are interconnected by vias,
at least a first and a second optically active area are connected in series such that a current flow within each of the at least the first and second optically active areas is directed in a direction extending between the base electrode and the cover electrode,
the contact layer contacts the cover electrode in the first optically active area,
the contact layer contacts the base electrode through one of the vias extending in a direction perpendicular or substantially perpendicular to the major planar surfaces of the layer stack in an interior of the second optically active area, so that the current flow passes between the at least two optically active areas through the contact layer,
the insulation layer is partially arranged between the contact layer and the cover electrode, so that within the second optically active area the respective contact layer is electrically insulated from the respective cover electrode, and
the insulation layer protects the organic layer assembly in the direction parallel or substantially parallel to the major planar surfaces of the layer stack,
wherein the luminous element forms a luminous surface and the luminous surface is formed by optically active areas arranged in a mosaic.

13. The luminous element according to claim 12, wherein the optically active areas are arranged in a quadrilateral, hexagonal or octagonal form.

* * * * *